(12) United States Patent
Martin

(10) Patent No.: US 7,050,467 B1
(45) Date of Patent: May 23, 2006

(54) DIGITAL-TO-PHASE-CONVERTER

(75) Inventor: Frederick L. Martin, Plantation, FL (US)

(73) Assignee: Motorola, Inc., Schaumburg, IL (US)

( * ) Notice: Subject to any disclaimer, the term of this patent is extended or adjusted under 35 U.S.C. 154(b) by 1197 days.

(21) Appl. No.: 09/633,705

(22) Filed: Aug. 7, 2000

(51) Int. Cl.
*H04J 3/06* (2006.01)
*H03L 7/00* (2006.01)

(52) U.S. Cl. .................. 370/517; 370/503; 370/518; 370/519; 327/141; 327/161; 327/162; 327/163

(58) Field of Classification Search .............. 370/503, 370/516–519; 327/2, 3, 7, 10, 141, 161, 162, 327/163, 231, 233, 234, 235, 261, 276, 277, 327/284

See application file for complete search history.

(56) References Cited

U.S. PATENT DOCUMENTS

| | | | |
|---|---|---|---|
| 5,503,400 A | | 4/1994 | Mogi |
| 5,471,659 A | | 11/1995 | Wong |
| 5,535,247 A | | 7/1996 | Gailus et al. |
| 5,668,830 A | * | 9/1997 | Georgiou et al. ........... 375/220 |
| 4,742,583 A | | 5/1998 | Fubumura |
| 5,748,683 A | | 5/1998 | Smith et al. |
| 5,913,155 A | | 6/1999 | Tomiyama |
| 5,945,862 A | * | 8/1999 | Donnelly et al. ........... 327/278 |
| 6,028,462 A | * | 2/2000 | Kyles ..................... 327/277 |
| 6,044,120 A | | 3/2000 | Bar-David et al. |
| 6,100,735 A | | 8/2000 | Su |
| 6,101,197 A | * | 8/2000 | Keeth et al. .............. 370/517 |
| 6,148,186 A | | 11/2000 | Fujita |
| 6,205,193 B1 | | 3/2001 | Solve et al. |
| 6,226,505 B1 | | 5/2001 | Uda |
| 6,236,690 B1 | | 5/2001 | Mimura et al. |
| 6,353,649 B1 | | 3/2002 | Bockleman et al. |
| 6,515,633 B1 | | 2/2003 | Ippolito |
| 6,556,630 B1 | | 4/2003 | Brinsfield et al. |
| 2002/0032042 A1 | | 3/2002 | Poplawsky et al. |

OTHER PUBLICATIONS

Nosaka, H., Nakagawa, T., and Yamagishi, A., "A Phase Interpolation Direct Digital Synthesizer with a Digitally Controlled Delay Generator," NTT Wireless Systems Laboratories, 1–1 Hikarinooka Yokosuka–shi, Kanagawa 239, Japan, 1997 Symposium on VLSI Circuits.
U.S. Appl. No. 09/780,077, filed Feb. 9, 2001, Poplawsky et al.
U.S. Appl. No. 10/000,914, filed Nov. 2, 2001, Juan.
U.S. Appl. No. 10/036,558, filed Dec. 21, 2001, Martin.
U.S. Appl. No. 10/050,233, filed Jan. 16, 2002, Stengel.
Gibson, J. "The Communications Handbook" 1997, CRC Press p. 11.

* cited by examiner

*Primary Examiner*—Steven Nguyen
*Assistant Examiner*—Roberta A. Shanh

(57) ABSTRACT

A digital-to-phase or digital-to-time-shift converter (100) includes a delay line (106), a multiplexor (108) and synchronization circuit (110). In the converter (100) the clock edges of a reference signal are shifted in response to the value of a multi-bit digital word, IN (104). The synchronization circuit (110) gates the output of the multiplexor (108) such that a pulse appears at the synchronization circuit's (110) output port (114) only when the circuit is gated by a signal at input TRIG (112). The synchronization circuit (110) creates a time aperture for the multiplexor output.

4 Claims, 4 Drawing Sheets

DIGITAL-TO-PHASE-CONVERTER

TECHNICAL FIELD

This invention relates in general to electrical circuits, and more specifically to a digital-to-phase converter.

BACKGROUND

Current state of the art implementations of high-speed digital-to-phase converters for use in a frequency synthesis application provide approximately 40 megahertz (MHz) speed of operation and −40 dBc spurs (approximately 6-bit resolution) resolution. This is insufficient for most communication applications, where 1-gigahertz (GHz) operation and resolutions in the order of −80 dBc spurs are typical design benchmarks. A need thus exists in the art for a digital-to-phase converter that provides for improved resolution and speed.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
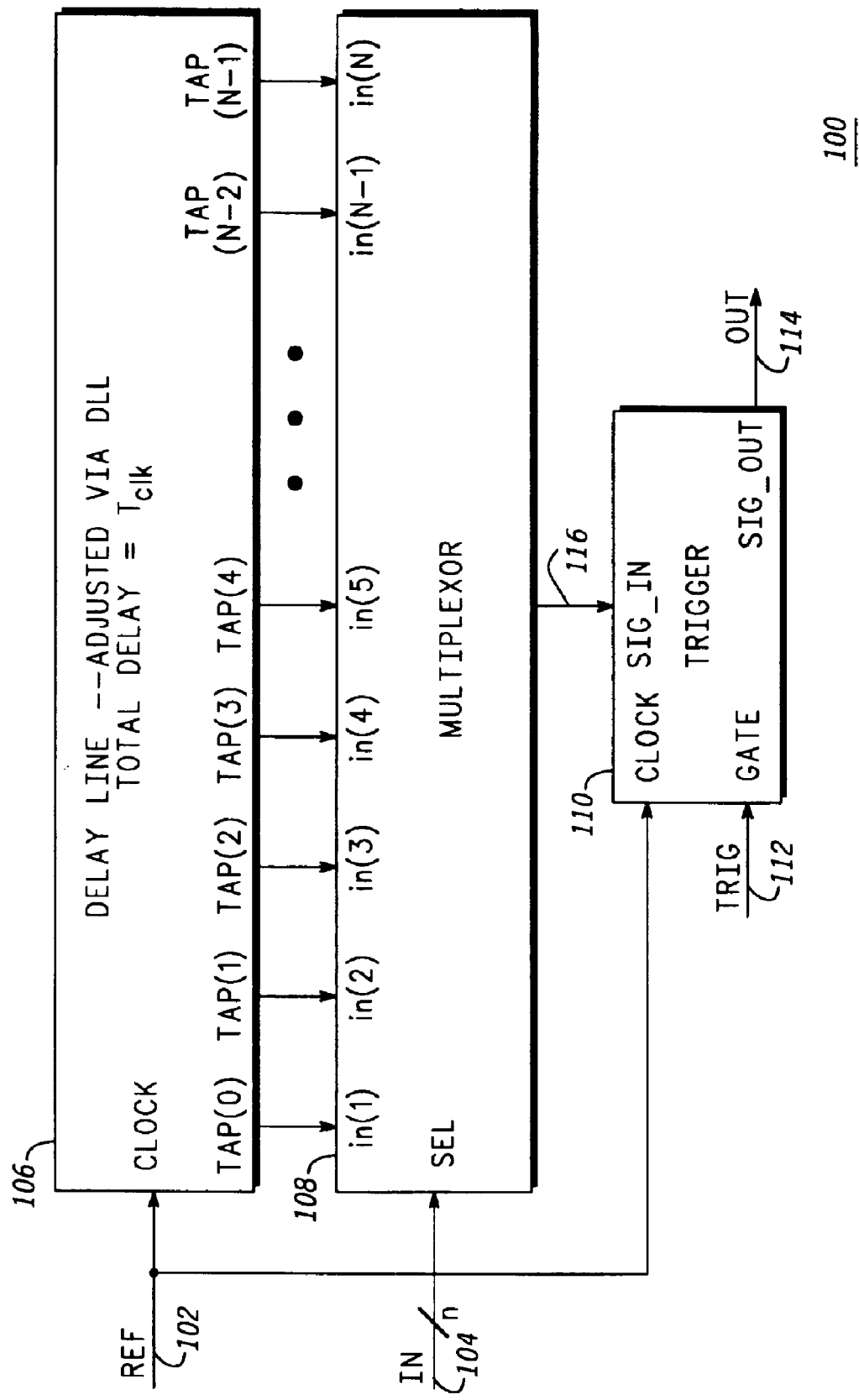
FIG. 1 shows a block diagram of a digital-to-phase converter in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is shown a digital-to-phase converter (DPC) 100 in accordance with the invention. DPC 100 includes a tuned delay line 106 preferably using a delay-locked loop (DLL) with (N) equally spaced delay taps, a conventional multiplexor or selector circuit 108 and a synchronization circuit 110. Inputs to the DPC 100, in addition to supply and ground, are an n-bit (n>=$\log_2$N) binary word (IN) 104, a binary reference clock (REF) 102 and a binary trigger signal (TRIG) 112. The circuit output is a single binary output signal (OUT) 114.

In operation, the DLL 106 is locked to the reference clock input "$Sref_0(t)$" such that "N" identical, but time shifted, versions of the reference clock are produced on the plurality of outputs of delay line 106. Each output or tap on the delay line is shifted by Tref/N, where Tref is the period of the reference clock. The "ith" tap on the delay line 106 can be described as:

$$Sref_i(t) = Sref_0\left(t - \frac{iTref}{N}\right).$$

The multiplexor 108 contains N inputs, one corresponding to each tap on the delay line. The synchronization circuit 110 gates the output 116 of the multiplexor 108 such that a pulse appears at the synchronization circuit's output port OUT 114 only when it is gated by a signal at input TRIG 112. The synchronization circuit 110 in accordance with the invention operates by creating a time aperture at the multiplexor output.

Figure 2:
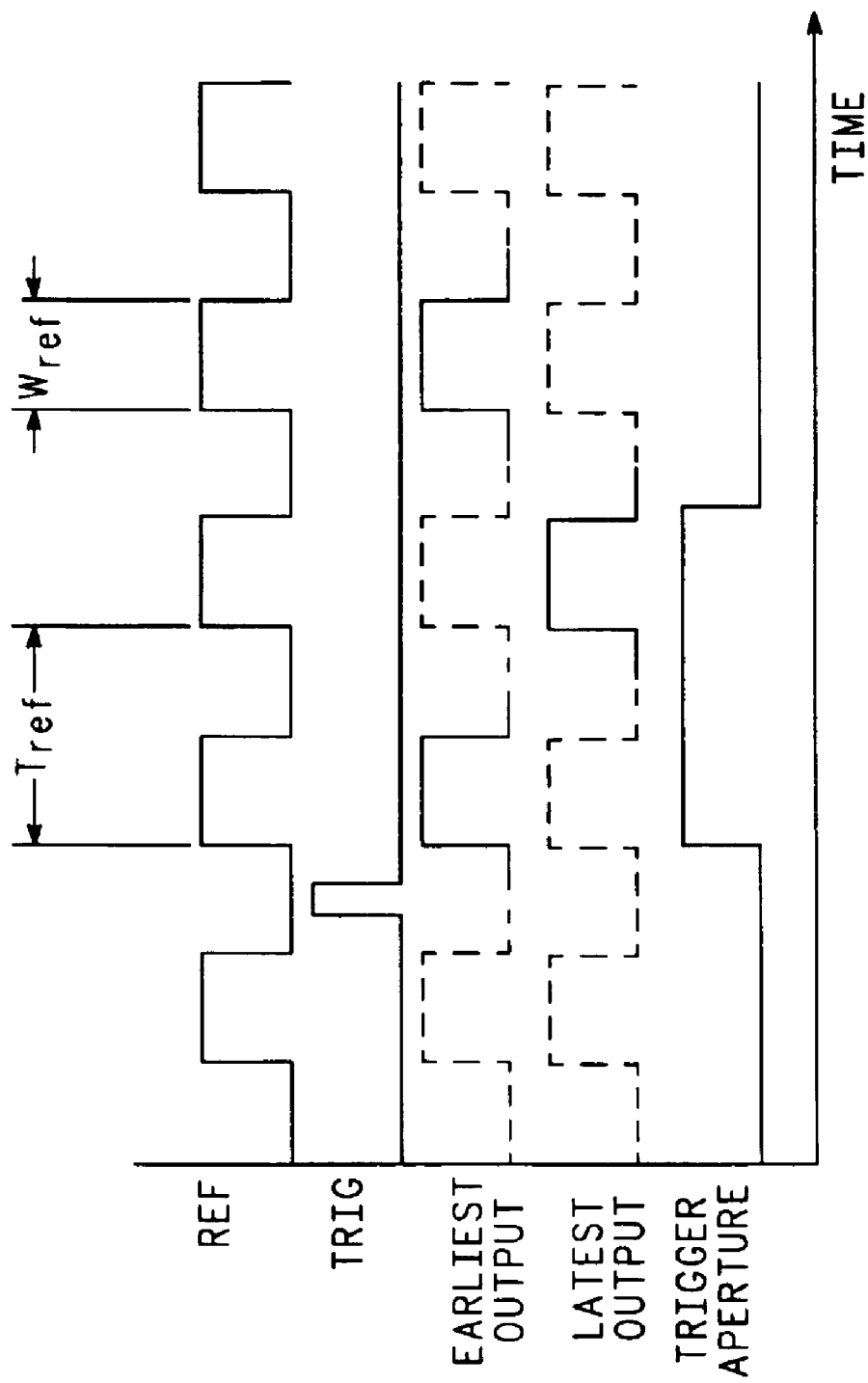
FIG. 2 shows a timing diagram showing the requirements for a synchronization circuit in accordance with the invention.

The timing diagram of FIG. 2 illustrates a time aperture in a first embodiment and also demonstrates two difficulties encountered with the DPC 100 in this first embodiment. The first problem with the time aperture is that, of necessity, the aperture has minimum time width Wref+Tref, where Wref is the width of the reference pulse. Note that Wref can be less than ½ of Tref in the embodiments of the present invention described herein. Because this time is longer than the period of the reference signal Tref, the pulse rate of the TRIG signal 112 is limited to less than the reference frequency of REF signal 102.

Figure 3:
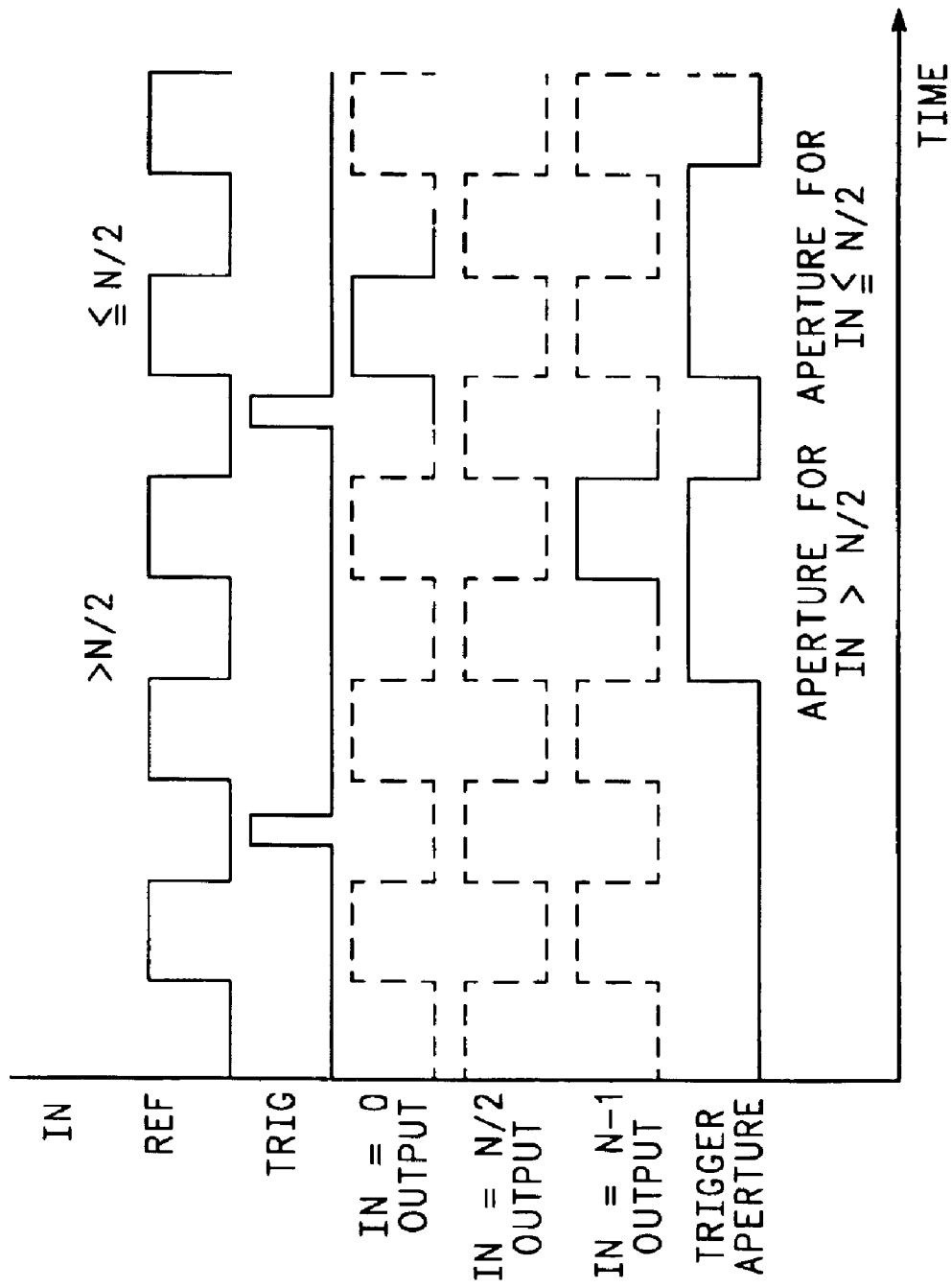
FIG. 3 shows timing diagram showing the time aperture divided into regions in accordance with the invention.

The second problem is that the time aperture is sufficiently wide that it can pass more than one pulse on a given signal, leading to an incorrect number of pulses in the converter output. A solution to this problem is used in a preferred embodiment to divide the time aperture into regions based on the value of the input signal. An example of this embodiment is shown in FIG. 3. In FIG. 3, two aperture regions are defined. For small IN 104 (IN<=N/2) the aperture begins on the first rising edge of the REF signal 102 after the first rising edge of the TRIG signal 112 and remains active for 3/2 Tref. For large IN (IN>N/2) the aperture begins on the first falling edge after the first rising edge of the REF signal 102 after a trigger signal and remains active for 3/2 cycle. For a mid-range signal (N=approximately N/2), only one pulse occurs during an aperture opening.

Figure 4:
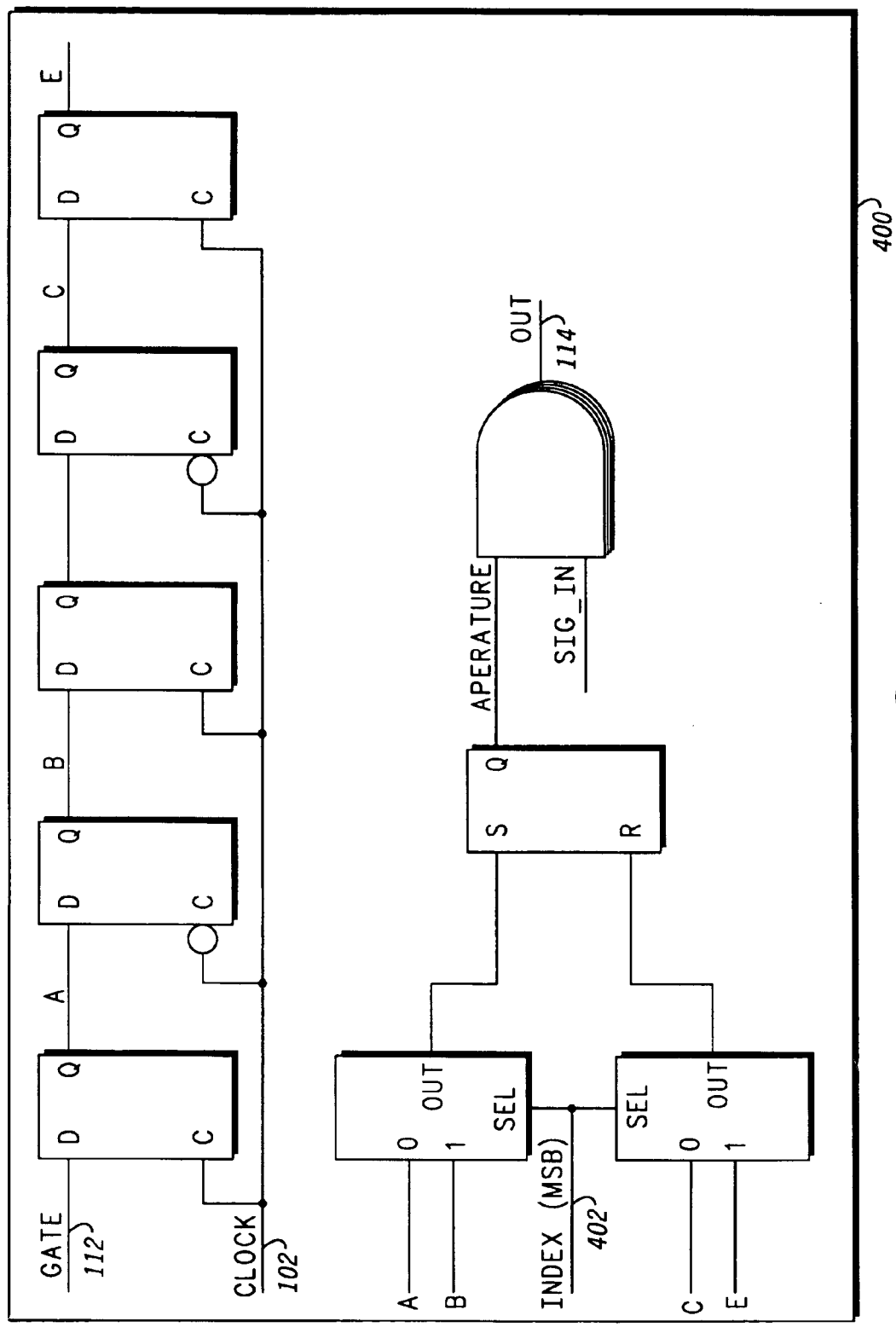
FIG. 4 shows a synchronization block for use with the digital-to-phase converter of FIG. 1.

The present invention shown in FIG. 1 can be realized using existing circuit techniques. The tuned delay line 106 can preferably be designed using a DLL although other tuning approaches known in the art can be used. The multiplexor 108 is of a conventional design as is known in the art. The aperture can be realized with the sequential circuit 400 shown in FIG. 4 in accordance with the preferred embodiment of the present invention, which is shown as trigger (or synchronization) circuit 110 in FIG. 1. The INDEX (msb) signal 402 is the most significant bit of the DPC input (IN) 104. Note that the INDEX input 402 to the synchronization circuit 110 is not shown in FIG. 1 in order to simplify the presentation. By narrowing the aperture window and gating its start time with information from the IN port 104 the tendency of the trigger circuit to pass multiple pulses through a single aperture window is solved. The points "A", "B", "C" and "E" on the top circuit of the sequential circuit 400 are connected to the their corresponding points on the lower circuit.

Although the preferred embodiment of DPC 100 has been described above, different variations of the invention can be done. For example, the delay line 106 can be implemented with an inverter chain where each inverter output represents a delay-line tap. In this third embodiment, the circuit is driven by a 50% duty cycle waveform and the multiplexor to delay line interface is ordered such that inverted versions of the input clock represent the input clock shifted by 180 degrees plus the time delay of the chain. This doubles the resolution of the circuit compared to a circuit with only non-inverted outputs used as taps.

Another embodiment of the present invention takes advantage of the periodic nature of the REF signal 102 and forms a delay line with multiple cycles of time delay. These multiple cycles of time delay can be used to increase resolution of the system. The delay-line to multiplexor interface in this embodiment is ordered to take advantage of full-cycle delays. The number of taps and the number of cycles cannot have common factors. Taps must be ordered so fractional portion of delay increases monotonically as the tap position number increases. As an example of this approach, tap ordering for the case of 17 delay gates, and 4 clock cycles of delay is demonstrated in Table 1 below.

TABLE 1

| Gate | Delay (as fraction of Tref) | Fractional portion of Delay (as fraction of Tref) | Tap position |
|------|------|------|------|
| 1  | 4/17  | 4/17  | 4  |
| 2  | 8/17  | 8/17  | 8  |
| 3  | 12/17 | 12/17 | 12 |
| 4  | 16/17 | 16/17 | 16 |
| 5  | 20/17 | 3/17  | 3  |
| 6  | 24/17 | 7/17  | 7  |
| 7  | 28/17 | 11/17 | 11 |
| 8  | 32/17 | 15/17 | 15 |
| 9  | 36/17 | 2/17  | 2  |
| 10 | 40/17 | 6/17  | 6  |
| 11 | 44/17 | 10/17 | 10 |
| 12 | 48/17 | 14/17 | 14 |
| 13 | 52/17 | 1/17  | 1  |
| 14 | 56/17 | 5/17  | 5  |
| 15 | 60/17 | 9/17  | 9  |
| 16 | 64/17 | 13/17 | 13 |
| 17 | 68/17 | 0/17  | 0  |

While several embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. The present invention can be used in for example; Voltage-controlled-oscillator-less (VCO-less) frequency synthesizers and modulators for use in communication devices, instrumentation, etc.

What is claimed is:

1. A digital-to-phase converter, comprising:

a delay line having a plurality of delay taps;

a multiplexor coupled to the delay line, the multiplexor having a plurality (N) of input ports for receiving the plurality of delay taps and an output port for providing an output signal and an input port for receiving an n-bit binary word (IN);

a synchronization circuit having a first input port for receiving the output signal from the multiplexor and a second input port for receiving a trigger signal, the synchronization circuit further having an output port for providing an output signal only when the synchronization circuit is gated by the trigger signal (TRIG); and a reference clock providing a reference signal (REF) to the delay line and the synchronization circuit, wherein the reference signal (REF) is a pulse train having rising and falling edges and the synchronization circuit forms an aperture region when IN<=N/2 that begins on the first rising edge of the reference signal (REF) after the first rising edge of the trigger signal (TRIG) signal and remains active for a predetermined period thereafter.

2. A digital-to-phase converter as defined in claim 1, wherein the predetermined period that the aperture region formed by the synchronization circuit remains active is approximately 3/2 the period (Tref) of the reference signal (REF).

3. A digital-to-phase converter as defined in claim 1, wherein the synchronization circuit forms an aperture region when IN>N/2 that begins on the first falling edge after the first rising edge of the reference signal (REF) after a trigger signal (TRIG) has occurred and the aperture region remains active for a predetermined period of time.

4. A digital-to-phase converter as defined in claim 3, wherein the predetermined period of time that the aperture remains active is for approximately 3/2 the period (Tref) of the reference signal.

* * * * *